United States Patent [19]
Ohkubo et al.

[11] Patent Number: 5,331,581
[45] Date of Patent: Jul. 19, 1994

[54] ARTIFICIAL RANDOM-NUMBER PATTERN GENERATING CIRCUIT

[75] Inventors: Chie Ohkubo; Yasuhiko Hagihara, both of Tokyo, Japan

[73] Assignee: NEC Corporation, Tokyo, Japan

[21] Appl. No.: 818,757

[22] Filed: Jan. 10, 1992

[30] Foreign Application Priority Data

Feb. 4, 1991 [JP] Japan .................. 3-013372

[51] Int. Cl.⁵ ........................... G06F 1/02
[52] U.S. Cl. ............................... 364/717
[58] Field of Search .......... 364/717; 380/46; 331/78

[56] References Cited

U.S. PATENT DOCUMENTS

| | | | |
|---|---|---|---|
| 3,875,377 | 4/1975 | Hirsch .................. | 331/78 |
| 4,377,757 | 3/1983 | Könemann et al. ......... | 307/303 |
| 4,860,236 | 8/1989 | McLeod et al. ........... | 364/717 |
| 5,105,376 | 4/1992 | Pedron .................. | 364/717 |

FOREIGN PATENT DOCUMENTS

0370194A2 9/1989 European Pat. Off. ..... G06F 11/26

*Primary Examiner*—Long T. Nguyen
*Attorney, Agent, or Firm*—Whitham, Curtis & Whitham

[57] ABSTRACT

An artificial random-number pattern generating circuit has a plurality of flip-flops each having a set signal input terminal and a clock signal input terminal; a plurality of selectors each of which forwards its output to the corresponding flip-flop and receives a first operation mode signal and/or a second operation mode signal; and an exclusive logical OR gate. The artificial random-number pattern generating circuit functions in three different ways, that is, as an artificial random-number pattern generator, a boundary scanning buffer or an input buffer, in accordance with the combinations of the first and second operation mode signals. The circuit can make not only a diagnosis of failure in the internal circuit of the large-scale integration (LSI) but also overall tests including those for input and output buffer circuits of the mounted LSI chip on a board or those for external wirings for the LSI.

8 Claims, 5 Drawing Sheets

ARTIFICIAL RANDOM-NUMBER PATTERN GENERATING CIRCUIT

BACKGROUND OF THE INVENTION

1. Field of the Invention

The present invention relates to an artificial random-number pattern (or parallel pattern) generator which is used for testing LSI circuits and, more particularly, to an artificial random-number pattern generator which is also capable of operating not only as an input or output buffer but also as a boundary scanning buffer only by means of the switching of operation mode signals.

2. Description of the Related Art

Conventionally, in order to realize in an LSI chip a built-in self testing (BIST) which has a testing function for making diagnosis of failure in or malfunction of the LSI by utilizing the artificial random-number patterns, there has been added an artificial random-number pattern generator in the LSI chip.

Such artificial random-number pattern generator is formed, for example, as shown in FIGS. 1 and 2, by a plurality of flip-flops 11-14 each having a clock signal input terminal, and an exclusive OR gate 30 for receiving outputs from at least two flip-flops out of the plurality of flip-flops. Such artificial random-number pattern generator is disclosed in "Logic Design Principles", 1986, Prentice-Hall, Pages 458 and 469, U.S.A.

The conventional random-number pattern generators as described above only have a function of generating artificial random-number patterns and can make a diagnosis of failure only in the internal circuit of the LSI. A disadvantage in such conventional generators is that it is not possible to conduct overall tests including those for input and output buffer circuits of the mounted LSI chip on a board or those for external wirings of the LSI.

SUMMARY OF THE INVENTION

It is, therefore, an object of the invention to overcome the problems existing in the conventional generator and to provide an improved artificial random-number pattern generator.

It is another object of the invention to provide an artificial random-number pattern generator which is also capable of operating both as the boundary scanning buffer and the input or output buffer and which is realized by a simple repetition of the same basic circuits.

According to one aspect of the invention, there is provided an artificial random-number pattern generator which comprises:

a plurality of N flip-flops, a first to N-th (N being an integer and $N \geq 2$), each of which has an input terminal, a set signal input terminal and a clock signal input terminal;

a plurality of (N−1) selectors, a first to (N−1)th, each of which receives an output of the (1+i)th (i being an integer and $1 \leq i \leq (N-1)$) flip-flop and an i-th input data and selectively forwards to the input terminal of the i-th flip-flop either one of the output of the (1+i)th flip-flop and the i-th input data or an exclusive logical OR thereof in accordance with a first operation mode signal and a second operation mode signal;

an artificial random-number producing means which receives outputs from at least two of the N flip-flops, conducts a predetermined logical operation on the outputs, and outputs an artificial random-number data of 1 bit; and an N-th selector which receives the output data from the artificial random-number producing means, an external output data, and an N-th input data, and which selectively forwards to the input terminal of the N-th flip-flop either one of the external output data and the N-th input data or an exclusive logical OR of the output data from the artificial random-number producing means and the N-th input data in accordance with the first and second operation mode signals.

whereby the artificial random-number pattern generator operates as either one of an artificial random-number pattern generator, a boundary scanning buffer and an input buffer in accordance with the combinations of the first and second operation mode signals.

According to a first and a second embodiment of the invention, the artificial random-number pattern generator operates in three kinds of modes, namely, an artificial random-number pattern generating mode, a boundary scanning buffer mode and an input buffer mode, in accordance with the combinations of the first operation mode signal and the second operation mode signal which are supplied to the selectors. According to these three operation modes, signals are forwarded to the related flip-flops. In this way, it is only by the addition of the selectors to the conventional artificial random-number pattern generator that such generator becomes capable of functioning not only as the artificial random-number pattern generator but also as a boundary scanning buffer and an input/output buffer for the LSI chip.

According to another aspect of the invention, there is also provided an artificial random-number pattern generator which comprises:

a plurality of (N+1) flip-flops, a first to (N+1)th ($N \geq 2$), each of which has an input terminal, a set signal input terminal and a clock signal input terminal;

a plurality of N selectors, a first to N-th, each of which receives an output of the (1+i)th ($1 \leq i \leq (N-1)$) flip-flop and an i-th input data and selectively forwards to the input terminal of the i-th flip-flop either one of the output of the (1+i)th flip-flop and the i-th input data in accordance with a first operation mode signal;

an artificial random-number producing means which receives outputs from at least two of the (N+1) flip-flops, conducts a predetermined logical operation on the outputs, and outputs an artificial random-number data of 1 bit; and an (N+1)th selector which receives the output data from the artificial random-number producing means and an external output data, and which selectively forwards to the input terminal of the (N+1)th flip-flop either one of the output data from the artificial random-number producing means and the external output data in accordance with the second operation mode signal, whereby the artificial random-number pattern generator operates as either one of an artificial random-number pattern generator, a boundary scanning buffer and an input buffer in accordance with the combinations of the first and second operation mode signals.

According to a third and a fourth embodiment of the invention, in order to generate artificial random-number patterns of N-bits, the artificial random-number pattern generator is provided with flip-flops and selectors constituted by N+1 number of the basic circuits which are a repetition of substantially the same circuit. To the particular one (1) added selector are inputted an output of the exclusive OR gate and an external output data so that, by causing one of them to be outputted therefrom according to the operation mode signal, it is possible to arrange the artificial random-number generator by simple repetition by the number N+1 of the same flip-flops and the same two-input selectors. In this way, according to these embodiments, it is possible to avoid such problems that three-input type selector having a complex circuit configuration is required for the particular one of the selectors and that the overall circuit is constituted by a number of circuit stages thereby resulting in low speed operation.

BRIEF DESCRIPTION OF THE DRAWINGS

The above and other objects, features and advantages of the present invention will be apparent from the following description of preferred embodiments of the invention, with reference to the accompanying drawings, in which.

Figure 1:
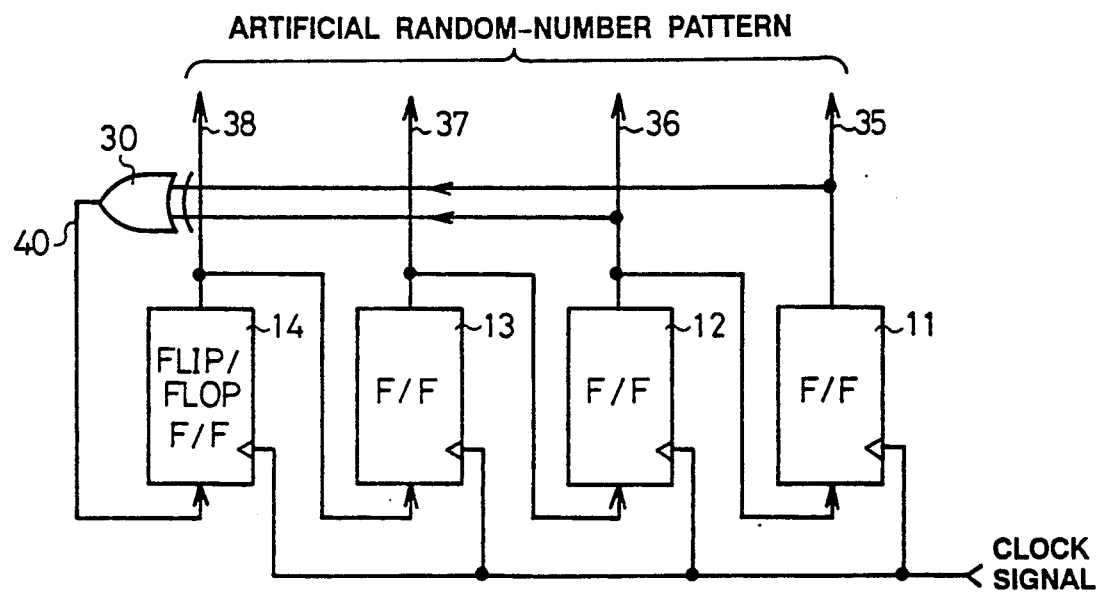
FIG. 1 is a block diagram of a conventional artificial random-number pattern generator.

selectively forwards to the flip-flop f either one of such output data and such input data as it is or an exclusive logical OR thereof in accordance with a first operation mode signal C1 and a second operation mode signal C2; and exclusive OR gate 30 which receives and takes an exclusive logical OR of the output data 35, 36 of the flip-flop 11, 12 out of the four flip-flops 11-14 and outputs an artificial random-number output data 40; and a 3-input selector 25 which receives the output data 40 from the exclusive OR gate 30, an external output 10 of another adjacent flip-flop (not shown) and an input data 4 and which forwards selectively to the flip-flop 14 either one of the external output 10 and the input data 4 or an exclusive logical OR of the output data 40 and the input data 4 in accordance with the combinations of the first and second operation mode signals C1 and C2. The adjacent flip-flop issuing the external output 10 mentioned herein refers to such flip-flop which immediately precedes and is connected to this artificial random-number pattern generator where it is incorporated in a portion of a boundary scanning path.

Figure 3:
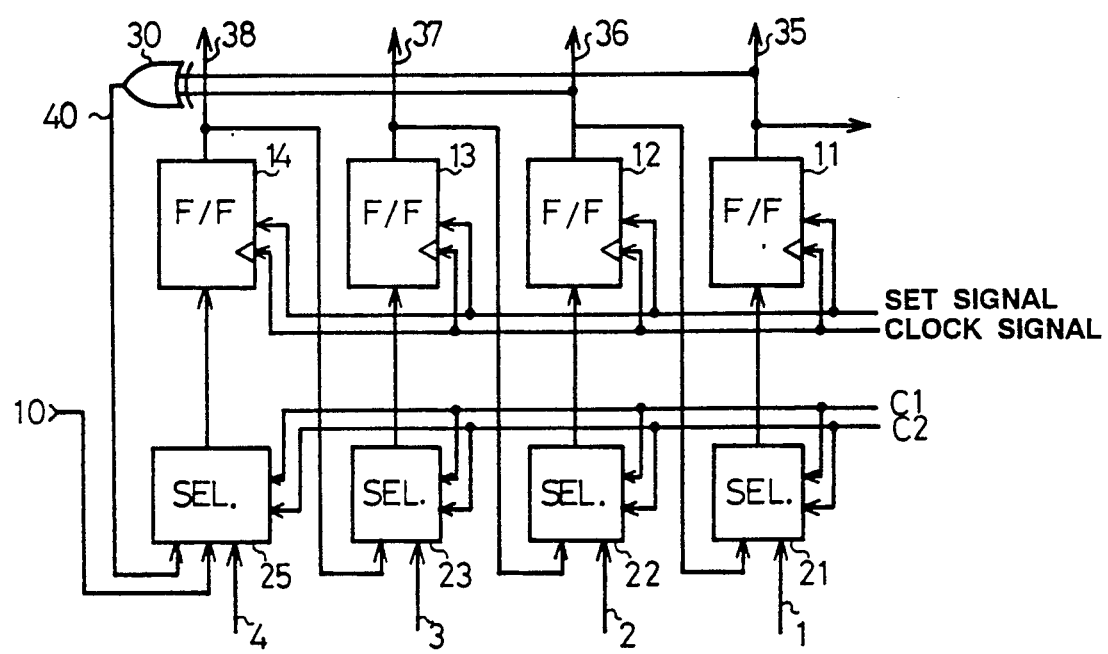
FIG. 3 is a block diagram of an artificial random-number pattern generator of a first embodiment according to the invention.

A table 1 shows the operation of the artificial random-number pattern generator shown in FIG. 3.

TABLE 1

| C1 | C2 | OUTPUTS OF FLIP-FLOPS f (f = 11,12,13) | OUTPUT OF FLIP-FLOP 14 | OPERATION MODE |
|---|---|---|---|---|
| 0 | 0/1 | INPUT DATA 1 (I = 1,2,3) | INPUT DATA 4 | INPUT BUFFER |
| 1 | 1 | OUTPUT OF FLIP-FLOP f + 1 | EXTERNALLY INPUT DATA 10 | BOUNDARY SCANNING BUFFER |
| 1 | 0 | EXCLUSIVE LOGICAL OR OF OUTPUT FROM F/F f + 1 AND INPUT DATA 1 | EXCLUSIVE LOGICAL OR OF OUTPUT DATA 40 FROM EX-OR 30 AND INPUT DATA 4 | ARTIFICIAL RANDOM-NUMBER PATTERN GENERATOR |

Figure 4:
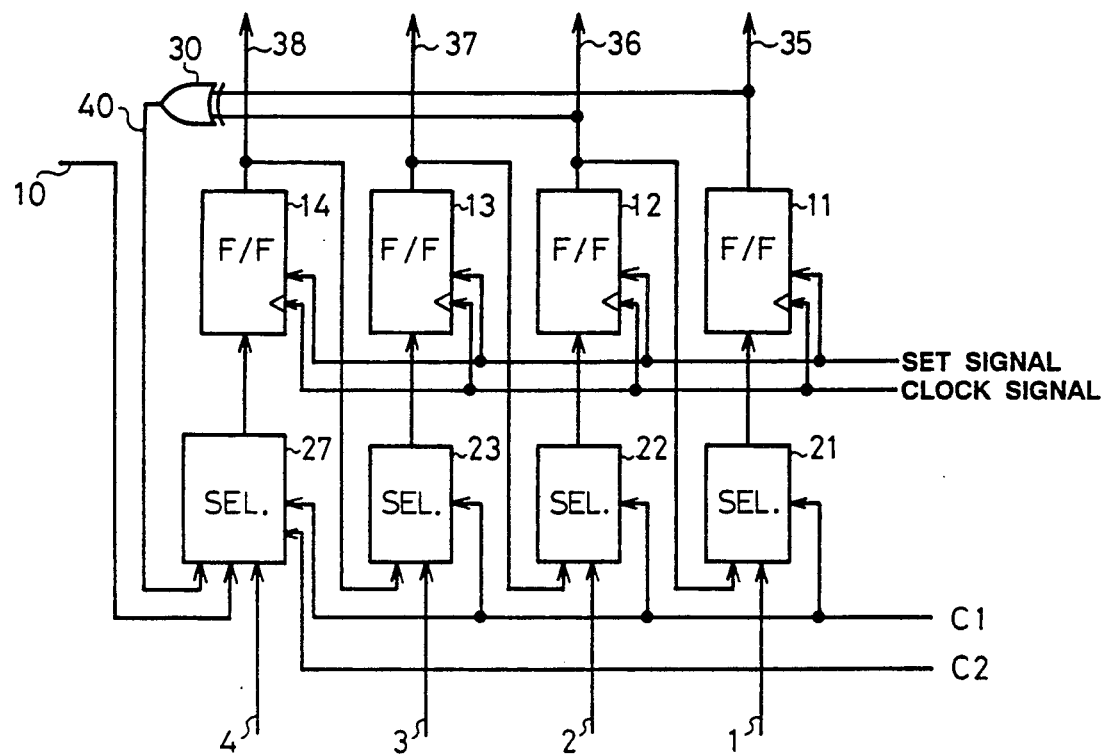
Figure 5:
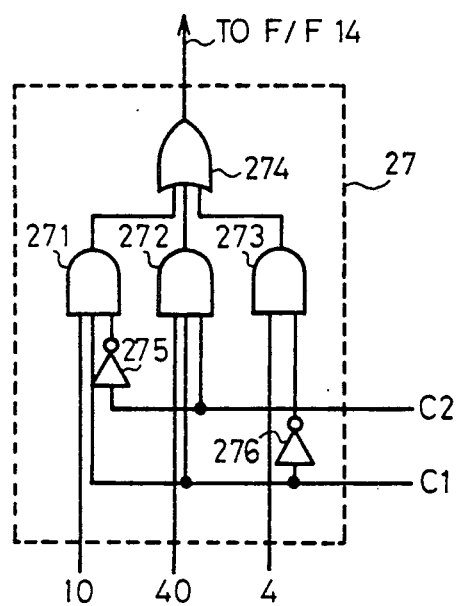
Figure 6:
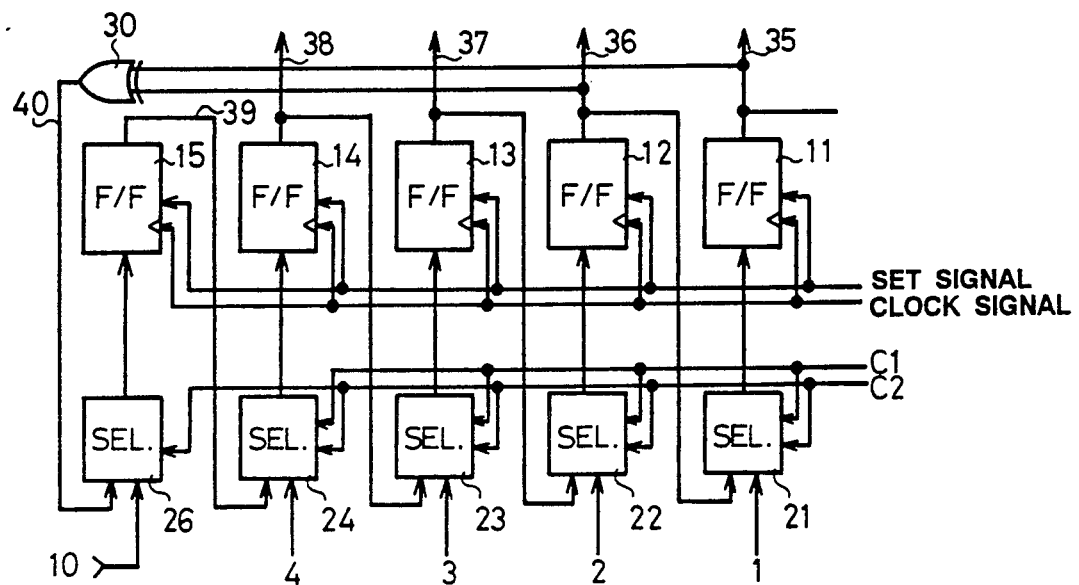
Figure 7:
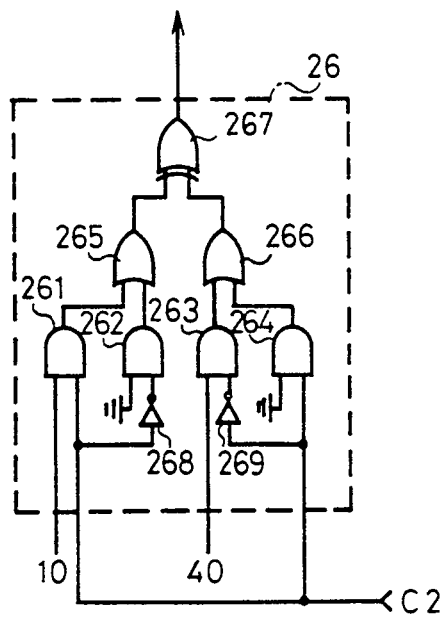
Figure 8:
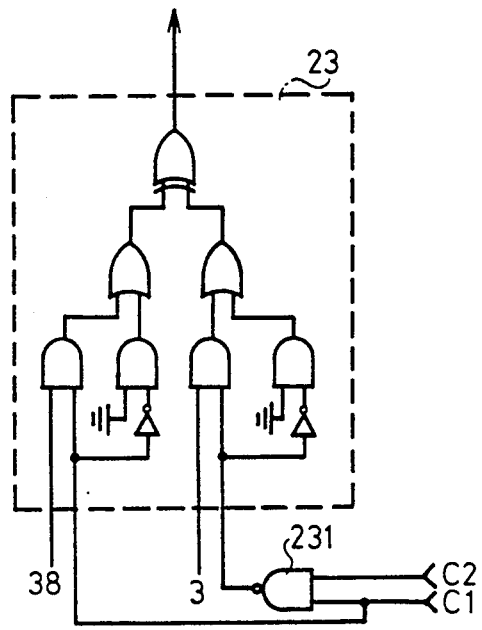
Figure 9:
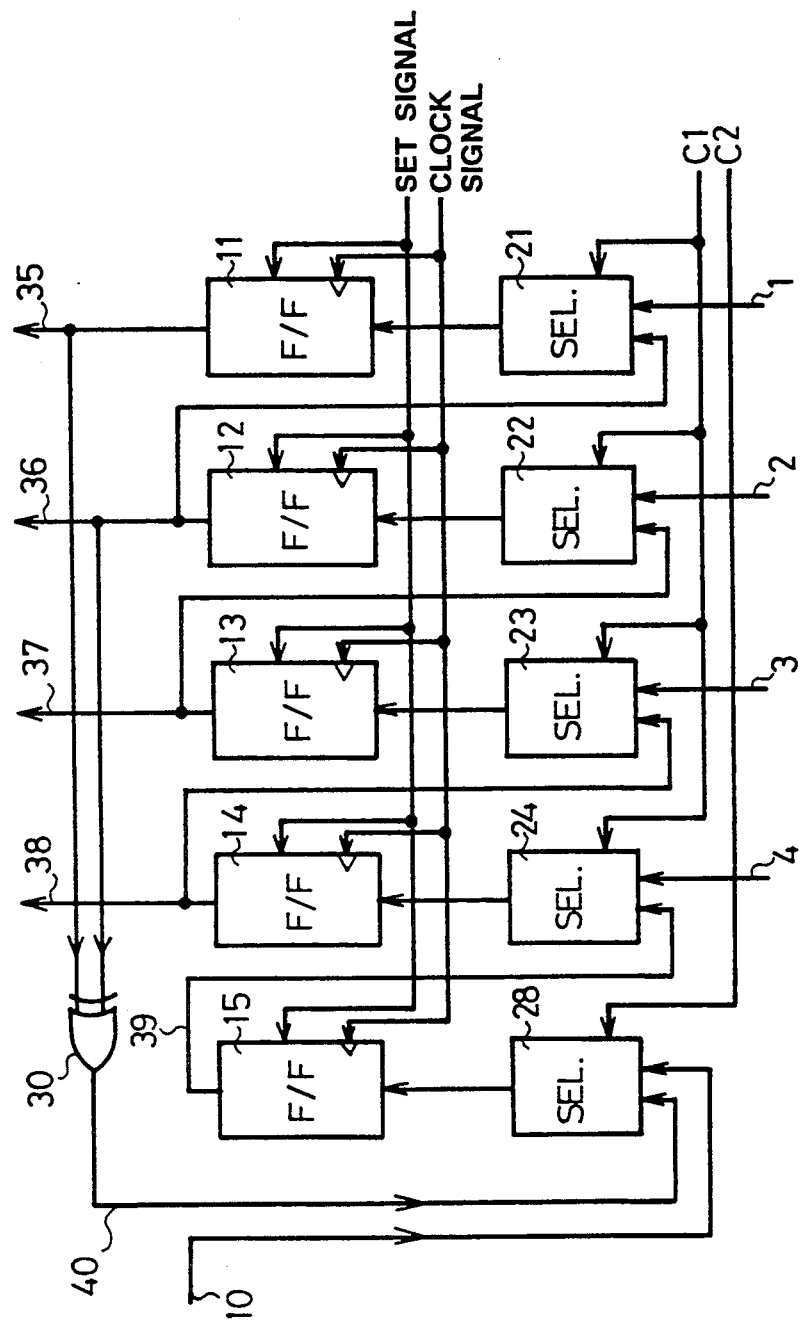

FIG. 4 is a block diagram of an artificial random-number pattern generator of a second embodiment according to the invention;

FIG. 5 is a detailed circuit diagram of a 3-input selector 27 used in the generator shown in FIG. 4;

FIG. 6 is a block diagram of an artificial random-number pattern generator of a third embodiment according to the invention;

FIG. 7 is a detailed circuit diagram of a selector 26 used in the generator shown in FIG. 6;

FIG. 8 is a detailed circuit diagram of a selector 23 used in the generator shown in FIG. 6; and FIG. 9 is a block diagram of an artificial random-number pattern generator of a fourth embodiment according to the present invention.

PREFERRED EMBODIMENTS OF THE INVENTION

Figure 2:
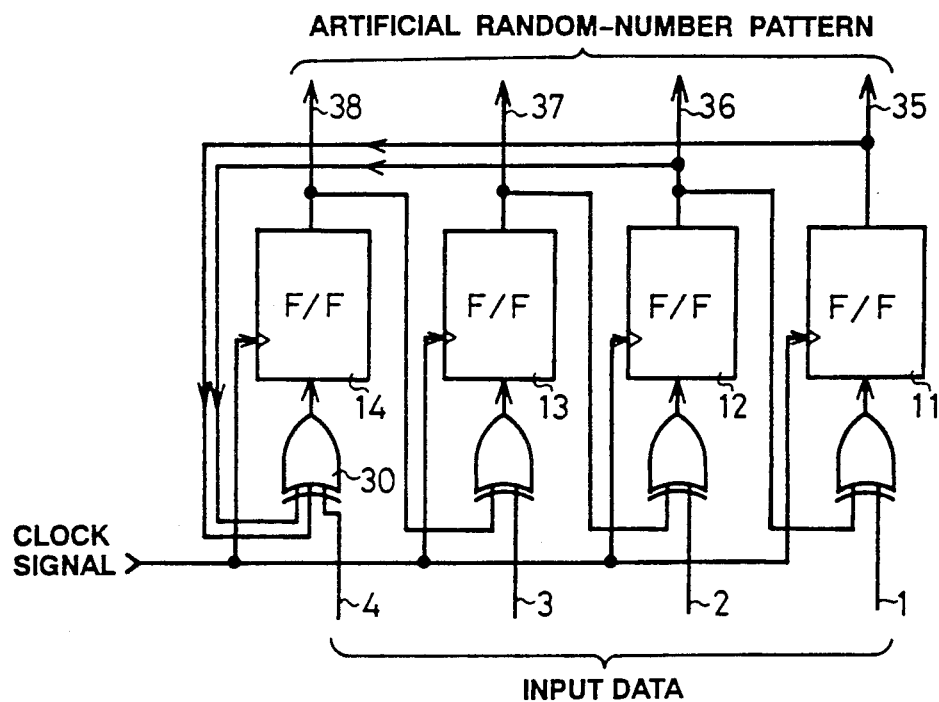
FIG. 2 is a block diagram of another conventional artificial random-number pattern generator.

Now, some preferred embodiments of the invention will be explained with reference to the appended drawings. It should be noted that the same or like elements of the conventional generators shown in FIGS. 1 and 2 are indicated with the same reference numerals or symbols in FIGS. 3 to 9.

FIG. 3 is a circuit diagram showing an artificial random-number pattern generator of a first embodiment according to the present invention. This embodiment shows a 4-bits artificial random-number pattern generator which comprises: four flip-flops 11-14 each of which has an input terminal, a set signal input terminal, a clock signal input terminal and an output terminal for outputting a corresponding one output of output data 35-38; selectors k (k = 21, 22, 23) each of which receives the output data j+1 (j=35, 36, 37) of the flip-flop f+1 (f=11, 12, 13) and an input data i (i=1, 2, 3) and which As shown in the above table 1, the artificial random-number pattern generator shown in FIG. 3 operates in three different ways in accordance with the combinations of the first operation mode signal C1 and the second operation mode signal C2 which are commonly supplied to the selectors 21-23 and 25.

When the signal C1="0" irrespective of the signal C2="0" or "1", the selectors 21-23 forward to the corresponding flip-flops 11-13 the corresponding input data 1-3, respectively. The selector 25 forwards to the flip-flop 14 the input data 4. Each of the flip-flops 11-14 outputs the input data 1-4 as it is with a delay of one clock signal. Thus, the artificial random-number pattern generator operates as an input or output buffer.

When the first operation mode signal C1="1" and the second operation mode signal C2="1", each of the selectors 21-23 selectively forwards an output 36-38 of the corresponding preceding flip-flop 12-14 to each of the flip-flops 11-13. The selector 25 forwards to the flip-flop 14 the external output 10 supplied from the external flip-flop. Each of the flip-flops 11-14 outputs the supplied data as it is with a delay of one clock signal, so that the overall circuit of this invention operates as a boundary scanning buffer.

When the first operation mode signal C1="1" but the second operation mode signal C2="0", each of the selectors 21-23 selectively forwards to each of the flip-flops 11-13 a corresponding exclusive logical OR of the output data 36, 37, 38 and the input data 1-3. The selector 25 forwards to the flip-flop 14 an exclusive logical OR of the output data 40 of the exclusive OR gate 30 and the input data 4. Each of the flip-flops 11-14 accordingly outputs the supplied data as it is with a delay of one clock signal, so that the overall circuit of this invention operates as a conventional artificial random-number pattern generator.

FIG. 4 is a circuit diagram showing an artificial random-number pattern generator of a second embodiment according to the present invention. This embodiment also shows a 4-bits artificial random-number pattern generator which comprises: four flip-flops 11-14 each of which has an input terminal, a set signal input terminal, a clock signal input terminal and an output terminal for outputting a corresponding one output of output data 35-38; selectors k (k=21, 22, 23) which receive the outputs j+1 (j=35, 36, 37) of the flip-flops f+1 (f=11, 12, 13) and input data i (i=1, 2, 3) and which forward to the flip-flops f either such outputs or such input data selectively in accordance with a first operation mode signal C1; an exclusive OR gate 30 which receives the output data 35, 36 of the two flip-flops 11, 12 out of the four flip-flops 11-14; and a 3-input selector 27 which receives an output data 40 of the exclusive OR gate 30, an external output 10 of another adjacent flip-flop (not shown) and an input data 4 and which forwards to the flip-flop 14 one of such output 40, output 10 and input data 4 selectively in accordance with the combinations of the first and second operation mode signals C1 and C2. In this embodiment, it should be noted that the first operation mode signal C1 is commonly supplied to the respective selectors 21-23, 27 but the second operation mode signal C2 is supplied only to the selector 27.

Here, FIG. 5 shows a detailed circuit diagram of the 3-input selector 27 shown in FIG. 4. The selector 27 includes two 3-input AND gates 271, 272, a 2-input AND gate 273, a 3-input OR gate 274 and two inverters 275, 276. The selector 27 selectively outputs one of the external output 10, the output 40 of the exclusive OR gate 30 and the input data 4 in accordance with the combinations of the first and second operation mode signals C1 and C2. Specifically, when the signal C1="1" and the signal C2="1", the selector 27 selectively outputs the output 40 of the exclusive OR gate 30, when C1="1" and C2="0", it outputs the output 10 of the other adjacent flip-flop and, when C1="0" irrespective of the value of C2, it outputs the input data 4.

The table 2 shows the operation of the artificial random-number pattern generator shown in FIG. 4.

operates as an artificial random-number pattern generator.

When the signal C1="1" but the signal C2="0", each of the flip-flops 11-13 receives an output of the corresponding preceding flip-flop 12-14 and outputs it as it is with a delay of one clock signal, whereas the flip-flop 14 outputs a signal in the value of the output 10 of the adjacent flip-flop, so that the overall circuit operates as a boundary scanning buffer which forms a part of the boundary scanning path.

When the signal C1="0" irrespective of the signal C2="1" or "0", each of the flip-flops 11-14 outputs the input data 1-4 as it is, so that the overall circuit operates as an input buffer.

As explained above, according to these first and second embodiments of the invention, it is by having the selector circuits simply added to the conventional artificial random-number pattern generator that such generator becomes capable of operating not only as the conventional pattern generator but also as a boundary scanning buffer and an input buffer for the LSI chip, so that it is made possible to test not only the internal circuits within the LSI but also other related circuits including an input buffer and external wirings.

FIG. 5 is a circuit diagram showing an artificial random-number pattern generator of a third embodiment according to the present invention. This embodiment shows also a 4-bits artificial random-number pattern generator which comprises: five flip-flops 11-15 each of which has an input terminal, a set signal input terminal, a clock signal input terminal and an output terminal for outputting a corresponding one output of output data 35-38; selectors k (k=21, 22, 23, 24) each of which receives the output data j+1 (j=35, 36, 37, 38) of the flip-flop f+1 (f=11, 12, 13, 14) and an input data i (i=1, 2, 3, 4) and which selectively forwards to the flip-flop f either one of such output data and such input data as it is or an exclusive logical OR thereof in accordance with the combinations of a first operation mode signal C1 and a second operation mode signal C2; an exclusive OR gate 30 which receives and takes an exclusive logical OR of the output data 35, 36 of the flip-flops 11, 12 out of the five flip-flops 11-15 and outputs an artificial random-number output data 40; and a selector 28 which receives the output data 40 from the exclusive OR gate 30 and an external output 10 of another external flip-flop (not shown) and which forwards selectively to the flip-flop 15 either one of the output data 40 and the output 10 in accordance with second operation mode signal C2. In this embodiment, it should be noted as the differences from the foregoing first and second embodiments shown in FIGS. 3 and 4 that all the selectors 21-24, 26 are of the 2-input type.

Here, FIG. 7 shows a detailed circuit diagram of the selector 26 in FIG. 6. The selector 26 is formed by, for

TABLE 2

| C1 | C2 | OUTPUTS OF FLIP-FLOPS f (f = 11,12,13) | OUTPUT OF FLIP-FLOP 14 | OPERATION MODE |
|---|---|---|---|---|
| 0 | 0 | INPUT DATA 1 (I = 1,2,3) | INPUT DATA 4 | INPUT BUFFER |
| 0 | 1 | INPUT DATA 1 (I = 1,2,3) | INPUT DATA 4 | INPUT BUFFER |
| 1 | 1 | OUTPUT OF FLIP-FLOP f + 1 | EXTERNALLY INPUT DATA 10 | BOUNDARY SCANNING BUFFER |
| 1 | 0 | OUTPUT OF FLIP-FLOP f + 1 | OUTPUT DATA 40 FROM EX-OR 30 | ARTIFICIAL RANDOM-NUMBER PATTERN GENERATOR |

As shown in the above table 2, the artificial random-number pattern generator shown in FIG. 4 operates in three different ways in accordance with the combinations of the first operation mode signal C1 and the second operation mode signal C2.

When the signal C1="1" and the signal C2="1", each of the flip-flops 11-13 receives an output of the corresponding preceding flip-flop 12-14 and outputs it as it is with a delay of one clock signal, whereas the flip-flop 14 outputs a signal in the value of the output 40 of the exclusive OR gate 30, so that the overall circuit example, four 2-input AND gates 261-264, two 2-input OR gates 265, 266, a 2-input exclusive OR gate 267 and two inverters 268, 269. The selector 26 selects and outputs the output data 40 from the exclusive OR gate 30 when the second operation mode signal C2="0", whereas it selects and outputs the external output data 10 when the signal C2="1".

FIG. 8 shows a detailed circuit diagram of the selector 23 in FIG. 6. The selector 23 has a NAND gate 231 which receives both the first and second operation mode signals C1, C2, in addition to the same circuit as the selector 26 shown in FIG. 7. The selector 23 selects and outputs the input data 3 when the first operation mode signal C1="0" irrespective of the value of the second operation mode signal C2. It selects and outputs the output data 38 of the preceding flip-flop 14 when both the first and second operation mode signals C1, C2="1". It selects and outputs an exclusive logical OR of the output data 38 of the preceding flip-flop 14 and the input data 3 when the first operation mode signal C1="1" but the second operation mode signal C2="0". Each of the remaining selectors 21, 22 and 24 has the same circuit configuration as that of the selector 23 explained above.

A table 3 shows the operation of the artificial random-number pattern generator shown in FIG. 6.

the overall circuit of this invention operates as a boundary scanning buffer.

When the first operation mode signal C1="1" but the second operation mode signal C2="0", each of the selectors 21-24 selectively forwards to each of the flip-flops 11-14 a corresponding exclusive logical OR of the output data 36, 37, 38, 39 and the input data 1, 2, 3, 4. The selector 26 forwards to the flip-flop 16 the output data 40 of the exclusive OR gate 30. Each of the flip-flops 11-14 accordingly outputs the supplied data at it is with a delay of one clock signal, so that the overall circuit of this invention operates as the same artificial random-number pattern generator as the conventional one.

FIG. 9 is a circuit diagram showing an artificial random-number pattern generator of a fourth embodiment according to the present invention. The embodiment also shows a 4-bits artificial random-number pattern generator which comprises: five flip-flops 11-15 each of which has an input terminal, a set signal input terminal, a clock signal input terminal and an output terminal for outputting a corresponding one of output data 35-39; selectors k (k=21, 22, 23, 24) which receive outputs j+1 (j=35, 36, 37, 38) of the flip-flops f+1 (f=11, 12, 13, 14) and input data i (i=1, 2, 3, 4) and which forward to the flip-flops f either such outputs or such input data

TABLE 3

| C1 | C2 | OUTPUTS OF FLIP-FLOPS f (f = 11,12,13,14) | OUTPUT OF FLIP-FLOP 14 | OPERATION MODE |
|---|---|---|---|---|
| 0 | 0 | INPUT DATA I (I = 1,2,3,4) | OUTPUT DATA 40 FROM EX- | INPUT BUFFER |
| 0 | 1 | INPUT DATA I (I = 1,2,3,4) | EXTERNALLY INPUT DATA 10 | INPUT BUFFER |
| 1 | 1 | OUTPUT OF FLIP-FLOP f + 1 | EXTERNALLY INPUT DATA 10 | BOUNDARY SCANNING BUFFER |
| 1 | 0 | EXCLUSIVE LOGICAL OR OF OUTPUT FROM F/F f + 1 AND INPUT DATA I | OUTPUT DATA 40 FROM EX-OR 30 | ARTIFICIAL RANDOM-NUMBER PATTERN GENERATOR |

As shown in the above table 3, the artificial random-number pattern generator shown in FIG. 6 operates in three different ways in accordance with the combinations of the first operation mode signal C1 and the second operation mode signal C2.

When the signal C1="0" irrespective of the signal C2="0" or "1", the selectors 21-24 forward to the corresponding flip-flops 11-14 the corresponding input data 1-4, respectively. Each of the flip-flops 11-14 thus outputs the input data 1-4 as it is. Thus, the artificial random-number pattern generator as a whole operates as an input or output buffer.

When the first operation mode signal C1="1" and the second operation mode signal C2="1", each of the selectors 21-24 selectively forwards an output 36-38 of the corresponding preceding flip-flop 12-15 to each of the flip-flops 11-14. The selector 26 forwards to the flip-flop 15 the output 10 supplied from the external flip-flop. Each of the flip-flops 11-14 outputs the supplied data as it is with a delay of one clock signal, so that selectively in accordance with the first operation mode signal C1; an exclusive OR gate 30 which receives outputs 35, 36 of the two flip-flops 11, 12 out of the five flip-flops 11-15; and a selector 28 which receives an output 40 of the exclusive OR gate 30 and an external output 10 of another adjacent flip-flop (not shown) and which forwards to the flip-flop 15 either such output 40 or such output 10 selectively in accordance with the second operation mode signal C2. In this embodiment, it should be noted as the differences from the first and second embodiments and further from the third embodiment that all the selectors 21-24, 28 are of the 2-input type, that the first operation mode signal C1 is commonly supplied to the selectors 21-24 excluding the selector 28, and that the second operation mode signal C2 is supplied to the selector 28 only but is not supplied to the remaining selectors 21-24.

The table 4 shows the operation of the artificial random-number pattern generator shown in FIG. 9.

TABLE 4

| C1 | C2 | OUTPUTS OF FLIP-FLOPS f (f = 11,12,13,14) | OUTPUT OF FLIP-FLOP 15 | OPERATION MODE |
|---|---|---|---|---|
| 0 | 0 | INPUT DATA I (I = 1,2,3,4) | EXTERNALLY INPUT DATA 10 | INPUT BUFFER |
| 0 | 1 | INPUT DATA I (I = 1,2,3,4) | OUTPUT DATA 40 FROM EX-OR 30 | INPUT BUFFER |
| 0 | 1 | OUTPUT OF FLIP-FLOP f + 1 | EXTERNALLY INPUT DATA 10 | BOUNDARY SCANNING BUFFER |
| 1 | 1 | OUTPUT OF FLIP-FLOP f + 1 | OUTPUT DATA 40 FROM EX- | ARTIFICIAL RANDOM- |

TABLE 4-continued

| OUTPUTS OF FLIP-FLOPS f C1 C2 (f = 11,12,13,14) | OUTPUT OF FLIP-FLOP 15 | OPERATION MODE |
|---|---|---|
| | OR 30 | NUMBER PATTERN GENERATOR |

As shown in the above table 4, the artificial random-number pattern generator of the fourth embodiment shown in FIG. 9 operates in three different ways in accordance with the combinations of the first operation mode signal C1 and the second operation mode signal C2.

When the first operation mode signal C1="0" irrespective of the value of the second operation mode signal C2, each of the flip-flops 11–14 outputs the corresponding input data 1–4 as it is with a delay of one clock signal and, when C1="1", each of the flip-flops 11–14 outputs the output data 36–39 of the corresponding immediately preceding flip-flop 12–15 with a delay of one clock signal. When the second operation mode signal C2= "0", the flip-flop 15 outputs the external output 10 of the other adjacent flip-flop with a delay of one clock signal and, when the same signal C2="1", it outputs the output 40 of the exclusive OR gate 30 with a delay of one clock signal. Thus, when the first operation mode signal C1="0", the input data 1–4 are outputted as they are irrespective of the value of the output of the flip-flop 15, that is, irrespective of the value of the second operation mode signal C2, so that the pattern generator operates as an input buffer.

When both the first and second operation mode signals C1 and C2="1", there is formed a shift register to which is applied a feedback through the exclusive OR gate 30, so that the pattern generator operates as an ordinary artificial random-number pattern generator.

When the first signal C1="1" but the second signal C2="0", since there is formed a shift register to which is inputted the output 10 of the flip-flop adjacently located in the boundary scanning path, the pattern generator operates as a boundary scanning buffer.

In particular, according to this fourth embodiment of the invention, with the mere repetition of the same basic circuits formed by the flip-flops and the selectors of the same type respectively, it is made possible to achieve the same object and function as achieved by any preceding embodiments.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. An N-bit artificial random-number pattern generator, comprising:
   a plurality of N flip-flops, a first to N-th (N≧2), each of which has an input terminal, a set signal input terminal and a clock signal input terminal;
   a plurality of (N−1) selectors, a first to (N−1)th, each of which receives an output of said (1+i)th (1≦i≦(N−1)) flip-flop and an i-th input data and selectively forwards its output to said input terminal of said i-th flip-flop;
   artificial random-number producing means for receiving outputs from at least two of said N flip-flops, conducting a predetermined logical operation on said outputs, and outputting an artificial random-number data of 1 bit; and
   an N-th selector which receives the output data from said artificial random-number producing means, an external output data, and an N-th input data, and which selectively forwards its output to the input terminal of said N-th flip-flop, said N-th selector being directly supplied with a first operation mode signal and a second operation mode signal.

2. An N-bit artificial random-number pattern generator according to claim 1, further comprising means for performing an exclusive logical OR operation of said output of said (1+i)th flip-flop and said i-th input data,
   wherein each of said plurality of (N−1) selectors is supplied with said first operation mode signal and said second operation mode signal, and selectively forwards to said input terminal of said i-th flip-flop one of said output of said (1+i)th flip-flop and said i-th input data, or an exclusive logical OR thereof in accordance with said first operation mode signal and said second operation mode signal; and
   wherein said N-th selector selectively forwards to the input terminal of said N-th flip-flop one of said external output data and said N-th input data, or an exclusive logical OR of said output data from said artificial random-number producing means and said N-th input data in accordance with said first and second operation mode signals,
   whereby said artificial random-number pattern generator is selectively operable as one of an artificial random-number pattern generator, a boundary scanning buffer and an input buffer in accordance with combinations of said first and second operation mode signals.

3. An N-bit artificial random-number pattern generator according to claim 1, in which:
   each of said plurality of (N−1) selectors is supplied with said first operation mode signal, and selectively forwards to said input terminal of said i-th flip-flop one of said output of said (1+i)th flip flop and said i-th input data in accordance with said first operation mode signal; and
   said N-th selector selectively forwards to the input terminal of said N-th flip-flop one of said output data from said artificial random-number producing means, said external output data and said N-th input data in accordance with said first and second operation mode signals,
   whereby said artificial random-number pattern generator is selectively operable as one of an artificial random-number pattern generator, a boundary scanning buffer and an input buffer in accordance with combinations of said first and second operation mode signals.

4. An N-bit artificial random-number pattern generator according to claim 1, in which said artificial random-number producing means comprises an exclusive OR gate which conducts an exclusive logical OR operation of at least two outputs from said plurality of N flip-flops.

5. An N-bit artificial random-number pattern generator, comprising:
- a plurality of (N+1) flip-flops, a first to (N+1)th (N≧2), each of which has an input terminal, a set signal input terminal and a clock signal input terminal;
- a plurality of N selectors, a first to N-th, each of which receives an output of said (1+i)th (1≦i≦N) flip-flop and an i-th input data and selectively forwards its output to said input terminal of said i-th flip-flop;
- artificial random-number producing means for receiving outputs from at least two of said (N+1) flip-flops, conducting a predetermined logical operation on said outputs, and outputting an artificial random-number data of 1 bit; and
- an (N+1)th selector which receives the output data from said artificial random-number producing means and an external output data, and which selectively forwards to the input terminal of said (N+1)th flip-flop one of said output data from said artificial random-number producing means and said external output data, said (N+1)th selector being directly supplied with a first operation mode signal and a second operation mode signal.

6. An N-bit artificial random-number pattern generator according to claim 5, further comprising means for performing an exclusive logical OR operation of said output of said (1+i)th flip-flop and said i-th input data,
- wherein each of said plurality of N selectors is supplied with said first operation mode signal and said second operation mode signal, and selectively forwards to said input terminal of said i-th flip-flop one of said output of said (1+i)th flip-flop and said i-th input data, or an exclusive logical OR thereof in accordance with said first operation mode signal and a second operation mode signal; and
- wherein said (N+1)th selector is supplied with said second operation mode signal and selectively forwards to the input terminal of said (N+1)th flip-flop one of said output data from said artificial random number producing means and said external output data in accordance with said second operation mode signal,
- whereby said artificial random-number pattern generator is selectively operable as one of an artificial random-number pattern generator, a boundary scanning buffer and an input buffer in accordance with combinations of said first and second operation mode signals.

7. An N-bit artificial random-number pattern generator according to claim 5, in which:
- each of said plurality of N selectors is supplied with said first operation mode signal, and selectively forwards to said input terminal of said i-th flip-flop one of said output of said (1+i)th flip-flop and said i-th input data in accordance with said first operation mode signal; and
- said (N+1)th selector selectively forwards to the input terminal of said (N+1)th flip-flop one of said output data from said artificial random-number producing means and said external output data in accordance with said second operation mode signal,
- whereby said artificial random-number pattern generator is selectively operable as one of an artificial random-number pattern generator, a boundary scanning buffer and an input buffer in accordance with combinations of said first and second operation mode signals.

8. An N-bit artificial random-number pattern generator according to claim 5, in which said artificial random-number producing means comprises an exclusive OR gate which conducts an exclusive logical OR operation of at least two outputs from said plurality of (N+1) flip-flops.

* * * * *